(12) United States Patent
Dyer et al.

(10) Patent No.: US 7,518,191 B1
(45) Date of Patent: *Apr. 14, 2009

(54) SILICON ON INSULATOR DEVICES HAVING BODY-TIED-TO-SOURCE AND METHODS OF MAKING

(75) Inventors: Thomas Dyer, Pleasant Valley, NY (US); Jack A. Mandelman, Flat Rock, NC (US); Keith Kwong Hon Wong, Wappinger Falls, NY (US); Chih-Chao Yang, Glenmont, NY (US); Haining Sam Yang, Wappinger Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/173,280

(22) Filed: Jul. 15, 2008

Related U.S. Application Data

(63) Continuation of application No. 12/052,807, filed on Mar. 21, 2008, now Pat. No. 7,442,614.

(51) Int. Cl.
*H01L 29/00* (2006.01)
(52) U.S. Cl. ...................................... 257/347
(58) Field of Classification Search ......... 257/347–355, 257/369, E21.544
See application file for complete search history.

(56) References Cited

U.S. PATENT DOCUMENTS

| 6,952,040 B2* | 10/2005 | Chau et al. .................. 257/412 |
| 7,176,527 B2 | 2/2007 | Fukuda |
| 7,300,846 B2* | 11/2007 | Jung .......................... 438/285 |

FOREIGN PATENT DOCUMENTS

EP 1419521 B1 5/2002

* cited by examiner

*Primary Examiner*—Nathan W Ha
(74) *Attorney, Agent, or Firm*—Cantor Colburn LLP; Yuanmin Cai

(57) ABSTRACT

Silicon on insulator devices having the body-tied-to-source are described. In an embodiment, a semiconductor device comprises: a gate conductor spaced above a semiconductor layer by a gate dielectric; dielectric spacers disposed laterally adjacent to sidewalls of the gate conductor; source and drain junctions laterally spaced apart by a body region in the semiconductor layer; and a conductive implant region comprising metallic species disposed in a bottom region of the semiconductor layer for electrically connecting the source junction to the body region, wherein a drain-side of the implant region is spaced apart from the body region and a source-side of the implant region contacts the body region.

2 Claims, 3 Drawing Sheets

SILICON ON INSULATOR DEVICES HAVING BODY-TIED-TO-SOURCE AND METHODS OF MAKING

CROSS-REFERENCE TO RELATED APPLICATION

The present application is a continuation of U.S. patent Ser. No. 12/052,807, filed Mar. 21, 2008, which is incorporated by reference herein.

BACKGROUND

This invention relates to semiconductor devices, and particularly to silicon on insulator devices having the body-tied-to-source and methods of fabricating such devices.

Demands for increased performance, functionality and manufacturing economy for integrated circuits have resulted in extreme integration density while also increasing the number of circuits and devices that can be formed on a wafer by a single sequence of processes. Scaling of devices to small sizes has restricted operating margins and has necessitated an increased uniformity of electrical characteristics of semiconductor devices formed on a wafer.

To satisfy this latter criterion, silicon on insulator (SOI) devices have been employed to exploit the improved quality of single crystalline silicon through an active layer thereof formed on an insulator residing upon a bulk silicon "handling" substrate. Various active layers can be formed upon the insulator that are electrically isolated from each other. As a result, SOI structures have reduced parasitic capacitances relative to bulk devices. The improved quality of the semiconductor material of the active SOI layers allows transistors and other devices to be scaled to extremely small sizes with good uniformity of electrical properties.

Unfortunately, the existence of the insulator layer (also referred to a "buried oxide layer" or "BOX") presents a problem known in the art as the "floating body effect" in SOI MOSFET (metal-on-silicon field effect transistor) devices. Those devices include a neutral floating body in the semiconductor layer that is spaced from the gate conductor by the gate dielectric. The neutral floating body is electrically isolated by source/drain and halo regions that form oppositely poled diode junctions at the ends of the transistor conduction channel and floating body. The insulator layer in the substrate completes insulation of the conduction channel and thus prevents discharge of any charge that may develop in the floating body. Charge injection into the neutral body when the transistor is not conducting develops voltages in the conduction channel in accordance with the source and drain diode characteristics.

The floating body effect is induced by the excess carriers generated by hot electrons near the strongly filed gradient drain region, resulting in enhanced body potential in SOI devices. This effect, in turn, induces a reduction in the threshold voltage $V_T$, causing a kink in the output characteristics. The voltage developed due to charge collection in the transistor conduction channel has the effect of altering the switching threshold of the transistor. This effect, in turn, alters the signal timing and signal propagation speed since MOSFET's have a finite slew rate and the rise and fall time of signals is not instantaneous even when the threshold voltage is not uniform across a given integrated circuit. SOI switching circuits, in particular, suffer from severe dynamic floating body effects such as hysteresis and history effects. The onset of the kink effect in SOI switching circuits strongly depends on operating frequency and produces Lorentzian-like noise overshoot and harmonic distortion. Soft error issues are also more serious in SOI MOSFET devices.

In order to limit the charge that builds up in the floating body, body contacts and body-tied-to-source structures have been incorporated in SOI MOSFET devices. However, current body-tied-to-source structures can require multiple processing steps and impose a layout penalty relative to non-body contacted devices.

BRIEF SUMMARY

The shortcomings of the prior art are overcome and additional advantages are provided through the provision of silicon on insulator devices having the body-tied-to-source by a conductive implant region. In one embodiment, a semiconductor device comprises: a gate conductor spaced above a semiconductor layer by a gate dielectric; dielectric spacers disposed laterally adjacent to sidewalls of the gate conductor; source and drain junctions laterally spaced apart by a body region in the semiconductor layer; and a conductive implant region comprising metallic species disposed in a bottom region of the semiconductor layer for electrically connecting the source junction to the body region, wherein a drain-side of the implant region is spaced apart from the body region and a source-side of the implant region contacts the body region.

In another embodiment, a semiconductor device comprises: a gate conductor spaced above a semiconductor layer by a gate dielectric; dielectric spacers disposed laterally adjacent to sidewalls of the gate conductor; source and drain junctions laterally spaced apart by a body region in the semiconductor layer; a conductive implant region comprising metallic species disposed in a bottom region of the semiconductor layer for electrically connecting the source junction to the body region; and amorphizing implant regions comprising amorphizing species disposed in upper regions of the source and drain junctions, the amorphizing implant regions being aligned to sidewall surfaces of the dielectric spacers.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION

Figure 1:
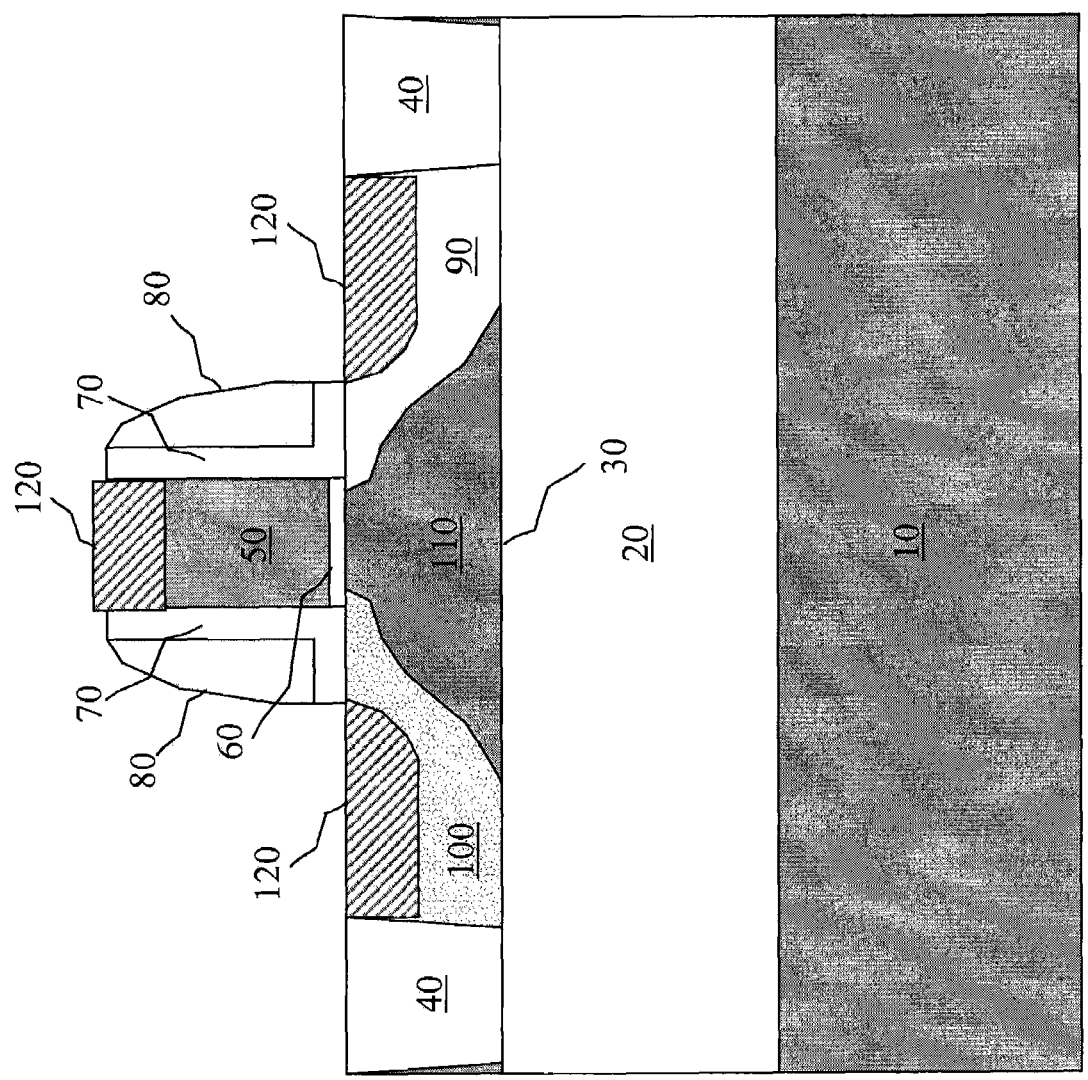
FIGS. 1-3 depict cross-sectional views of a SOI MOSFET device being fabricated, which includes a conductive implant region for electrically connecting the body to the source junction.
Figure 2:
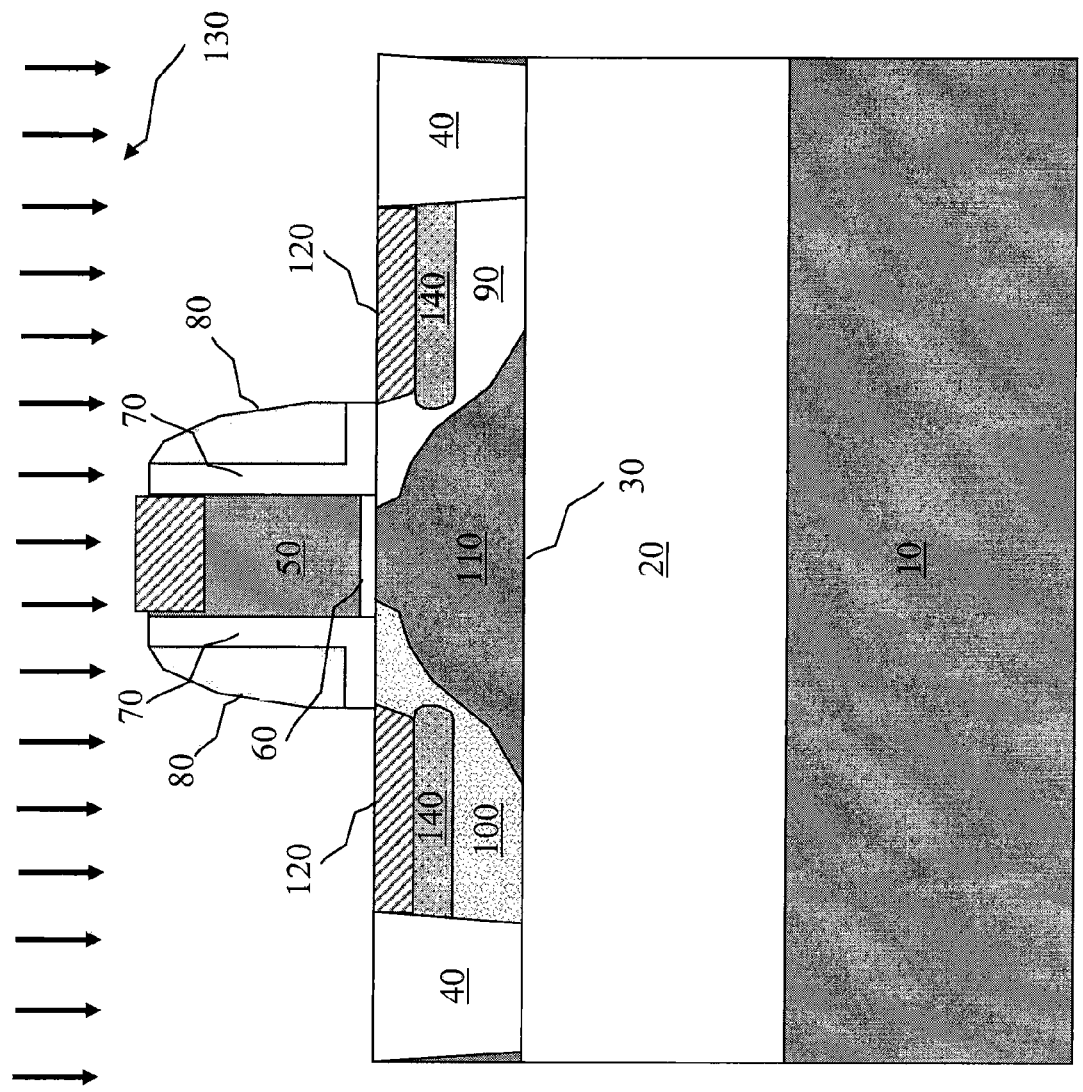
Figure 3:
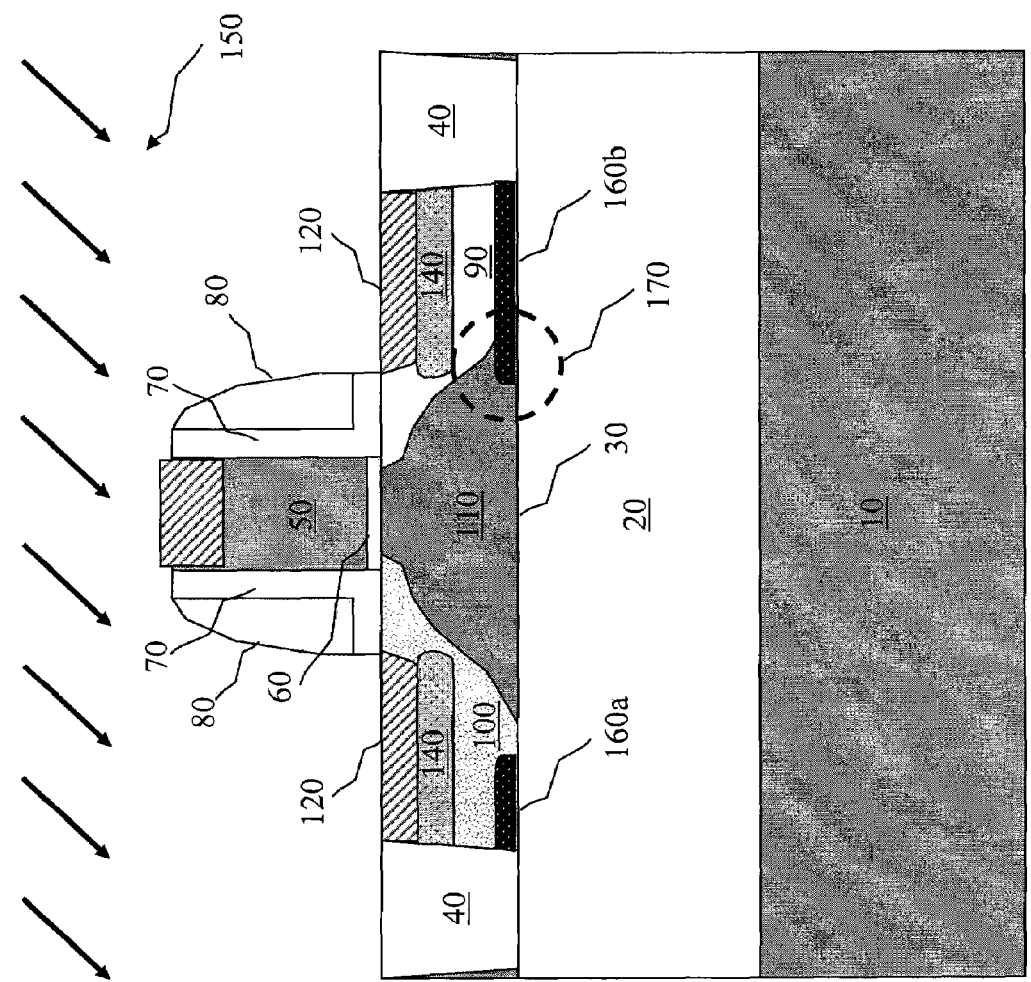

FIGS. 1-3 illustrate an exemplary embodiment of a method for fabricating a SOI transistor device (e.g., a MOSFET device) having the body-tied-to-source by asymmetrically implanting metallic species in the lower regions of the source and drain junctions. This unique method of connecting the body to the source can reduce or eliminate deleterious floating body effects. Further, it can be easily integrated with current semiconductor fabrication technology without increasing the complexity of fabricating SOI devices and imposing layout penalty relative to non-body contacted devices.

FIG. 1 depicts an exemplary embodiment of a SOI transistor device that can be fabricated in accordance with the following exemplary method. First, a substrate 10, e.g., a silicon-based substrate, can be provided upon which an insulator layer 20, such as a silicon dioxide (oxide) layer, is deposited by chemical vapor deposition (CVD). A semiconductor layer 30 comprising single crystalline silicon which has been slightly doped with n-type or p-type dopants can be formed across the insulator layer 20. Shallow trench isolation structures 40 also can be formed laterally adjacent to both sides of the semiconductor layer 30 to isolate it from other active areas. A gate conductor 130 comprising, e.g., polycrystalline silicon (polysilicon), and a gate dielectric 60 comprising, e.g., thermally grown oxide, can then be patterned above the semiconductor layer 110 using lithography followed by an etch technique.

After implanting lightly doped drain regions near the surface of the semiconductor layer 30, a dielectric (e.g., oxide) liner 70 can be formed upon the opposed sidewall surfaces of the gate conductor 50 via CVD followed by an anisotropic etch technique. Subsequently, a source junction 90 and a drain junction 100 that are aligned to the exposed sidewalls of the dielectric liner 70 can be implanted in the semiconductor layer 30 on opposite sides of the gate conductor 50. In the case of a NFET, the source/drain junctions 90, 100 can be implanted with n-type dopants, whereas in the case of a PFET, the source/drain junctions 90, 100 can be implanted with p-type dopants. Examples of n-type dopants include, but are not limited to, arsenic and phosphorus, and examples of p-type dopants include, but are not limited to, boron and boron difluoride. It is to be understood that both NFET and PFET devices can be formed above the insulator layer 20 to form a CMOS (complementary metal-oxide semiconductor) circuit. The formation of source/drain junctions 90, 100 also results in the formation of an oppositely doped body 110 between those junctions 90, 100.

Dielectric sidewall spacers 80 preferably comprising a material different from that of the oxide dielectric liner 70, such as silicon nitride, subsequently can be formed laterally adjacent the sidewalls of the dielectric liner 70 using CVD followed by an anisotropic etch technique. Optionally, metal silicide 120 can be formed upon the source/drain junctions 90, 100 and the gate conductor 50 by depositing a metal across the semiconductor topography and then annealing the metal such that it reacts with exposed silicon to form the metal silicide 120 selectively upon the source/drain junctions 90, 100 and the gate conductor 50. The excess metal can then be removed using a selective etch technique such as a wet chemical etch.

As shown in FIG. 2, prior to connecting the source 90 to the body 110, an amorphizing species can be implanted in upper regions of the source/drain junctions 90, 100 at an angle orthogonal to the surface of the semiconductor layer 30 (as indicated by arrows 130). As used herein, "an amorphizing species" refers to a species capable of changing the silicon in the semiconductor layer 30 from the crystalline phase to an amorphous phase. Examples of suitable amorphizing species include, but are not limited to, germanium (Ge), silicon (Si), and a combination comprising at least one of the foregoing species. As a result of this implantation step, amorphizing implant regions 140 are formed in upper regions of the source/drain junctions 90, 100 that are aligned to the exposed sidewall surfaces of the dielectric spacers 80. Since the amorphizing implant regions 140 are laterally spaced from the gate conductor 50, they do not impinge upon the depletion regions.

Turning to FIG. 3, a metallic species can be implanted into lower regions of the source/drain junctions 90, 100 to form a conductive implant region 160 or path (separated into drain-side region 160a and source-side region 160b) that electrically connects source junction 90 to body 110. As used herein, "metallic" refers to any material comprising metal including pure metals and alloys of metals. Examples of suitable metallic species for use in PFET's include, but are not limited to, transition metals such as platinum (Pt), iridium (Ir), nickel (Ni), tungsten (W), and cobalt (Co) and combinations comprising such metals. Examples of suitable metallic species for use in NFET's include, but are not limited to, rare earth metals such as ytterbium (Yb) and erbium (Er) and combinations comprising such metals. This implantation of metallic species can be directed to a backside of the semiconductor topography at an oblique angle relative to the surface of the semiconductor layer 30 (as indicated by arrows 150), causing the implant region 160 to be asymmetrical such that its drain-side 160a is spaced from the body 110 and is smaller than its source-side 160b, which intersects a corner of the body 110 (as indicated by dashed line 170) and thus serves as a body-tied-to-source structure. By restricting the implant to the backside of the transistor, damage to the top gated source-to-body junction that could compromise the function of the transistor is less likely to occur.

Subsequent to the formation of conductive implant region 160, the dielectric sidewall spacers 80 can be removed using, for example, a selective etch technique if the spacers 80 comprise nitride or an anisotropic etch technique if the spacers comprise oxide.

The metallic species of conductive implant region 160 can optionally be transformed to metal silicide to take advantage of the lower resistivity of the silicide. This conversion can be accomplished by annealing the semiconductor topography to cause the metallic species to react with the silicon atoms of the semiconductor layer 30. By way of example, the annealing can be performed in a furnace at, e.g., a temperature of about 400° C. to about 600° C. for a period of, e.g., about 1 hour to about 3 hours. Alternatively, the annealing can be performed using rapid thermal processing (RTP) by exposing the semiconductor topography to an arc lamp or a tungsten-halogen lamp at, e.g., a temperature of about 600° C. to about 800° C. for a period of, e.g., about 15 seconds to about 60 seconds.

The presence of the conductive implant region 160 in the source junction 90 provides for the ability to fine tune the body voltage and thus reduces shifts in $V_T$, parasitic sub-$V_T$, and bipolar conduction, improving the stability of SOI MOSFET devices. Further, the presence of the amorphizing implant regions 140 in the interior of the source and drain junctions 90, 100 provides a gettering site for crystal defects to be drawn away from the depletion regions and enables the drain leakage characteristics to be fine tuned. This ability to fine tune the drain leakage provides for an additional "knob" to control the body voltage, thus allowing an appropriate tradeoff between peformance and floating body immunity to be achieved.

As used herein, the terms "a" and "an" do not denote a limitation of quantity but rather denote the presence of at least one of the referenced items. Moreover, ranges directed to the same component or property are inclusive of the endpoints given for those ranges (e.g., "about 5 wt % to about 20 wt %," is inclusive of the endpoints and all intermediate values of the range of about 5 wt % to about 20 wt %). Reference throughout the specification to "one embodiment", "another embodiment", "an embodiment", and so forth means that a particular element (e.g., feature, structure, and/or characteristic) described in connection with the embodiment is included in at least one embodiment described herein, and might or might not be present in other embodiments. In addition, it is to be understood that the described elements may be combined in any suitable manner in the various embodiments. Unless defined otherwise, technical and scientific terms used herein have the same meaning as is commonly understood by one of skill in the art to which this invention belongs.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A semiconductor device comprising:
   a gate conductor spaced above a semiconductor layer by a gate dielectric;
   dielectric spacers disposed laterally adjacent to sidewalls of the gate conductor;
   source and drain junctions laterally spaced apart by a body region in the semiconductor layer; and
   a conductive implant region comprising metallic species disposed in a bottom region of the semiconductor layer for electrically connecting the source junction to the body region, wherein a drain-side of the implant region is spaced apart from the body region and a source-side of the implant region contacts the body region.

2. A semiconductor device comprising:
   a gate conductor spaced above a semiconductor layer by a gate dielectric;
   dielectric spacers disposed laterally adjacent to sidewalls of the gate conductor;
   source and drain junctions laterally spaced apart by a body region in the semiconductor layer;
   a conductive implant region comprising metallic species disposed in a bottom region of the semiconductor layer for electrically connecting the source junction to the body region; and
   amorphizing implant regions comprising amorphizing species disposed in upper regions of the source and drain junctions, the amorphizing implant regions being aligned to sidewall surfaces of the dielectric spacers.

\* \* \* \* \*